United States Patent [19]

Lee

[11] 4,301,519
[45] Nov. 17, 1981

[54] SENSING TECHNIQUE FOR MEMORIES WITH SMALL CELLS

[75] Inventor: Hsing-San Lee, Williston, Vt.

[73] Assignee: International Business Machines Corporation, Armonk, N.Y.

[21] Appl. No.: 145,927

[22] Filed: May 2, 1980

[51] Int. Cl.³ ............................................. G11C 11/40
[52] U.S. Cl. .................................... 365/189; 365/210
[58] Field of Search ................ 365/189, 205, 207, 210

[56] References Cited

U.S. PATENT DOCUMENTS

| | | | |
|---|---|---|---|
| 3,387,286 | 6/1968 | Dennard | 365/182 |
| 3,811,076 | 5/1974 | Smith, Jr. | 365/174 |
| 3,841,926 | 10/1974 | Garnache et al. | 365/174 |
| 4,040,017 | 8/1977 | Lee | 365/174 |
| 4,080,590 | 3/1978 | Pricer | 365/174 |
| 4,160,275 | 7/1979 | Lee et al. | 365/174 |

OTHER PUBLICATIONS

IBM Tech. Dis. Bul., vol. 22, No. 7, Dec. 1979, "One-Device Dynamic Bipolar Memory with Dummy Cells", J. E. Selleck, pp. 2683-2686.

Primary Examiner—Terrell W. Fears
Attorney, Agent, or Firm—Stephen J. Limanek

[57] ABSTRACT

A sensing technique or system is provided for a merged charge memory having similar storage and dummy cells with the dummy cells being charged with a reference voltage equal to ½ of the sum of the voltages representing 1 and 0 binary digits of information in the memory. The sensing technique or system includes an insulating layer disposed on a semiconductor substrate, a memory array having a data word line coupled to a first plurality of spaced apart conductive films formed on the insulating layer defining a plurality of data storage capacitors, sensing means having first and second terminals and a dummy line coupled to a second plurality of spaced apart conductive films formed on the insulating layer defining a plurality of reference voltage capacitors. Charge source means are coupled to the first plurality of conductive films by the word line and to the second plurality of conductive films by the dummy line. The first terminal of the sensing means is coupled to a conductive film of the first plurality of films spaced a predetermined distance from the charge source means and the second terminal of the sensing means is coupled to a given conductive film of the second plurality of films spaced the predetermined distance from the charge source means. The reference voltage is derived from the first and second terminals of the sensing means and applied to the given conductive film.

11 Claims, 3 Drawing Figures

WRITE "0"

SENSING TECHNIQUE FOR MEMORIES WITH SMALL CELLS

TECHNICAL FIELD

This invention relates to integrated semiconductor memory circuits and more particularly to a sensing technique for memory circuits having small cells for storing binary digits of information.

BACKGROUND ART

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs essentially only a storage capacitor and a field effect transistor acting as a switch to selectively connect the capacitor to a bit/sense line. In also commonly assigned U.S. Pat. Nos. 3,811,076 by W. M. Smith and 3,841,926 by R. R. Garnache and W. M. Smith, both filed Jan. 2, 1973, there is disclosed a one-device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

In another commonly assigned U.S. Pat. No. 4,080,590, filed Mar. 31, 1976, by W. D. Pricer, there is disclosed a merged charge memory produced in a unipolar technology which is provided with very small capacitor cells, each of which includes substantially only a small storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced-apart relationship from the charge source. Voltage pulses representing binary digits are applied to one terminal of the capacitors and the other terminal of the capacitors is coupled to the direct source of charges by the application of a word pulse to a word line.

In yet another commonly assigned U.S. Pat. No. 4,040,017, filed Mar. 31, 1976, by H. S. Lee, there is disclosed a capacitor memory similar to that disclosed in the above-identified U.S. Pat. No. 4,080,590 wherein the charges are produced from a charge source in the form of pulses injected into the storage capacitors rather than by utilizing a direct current source of charges.

In commonly assigned U.S. patent application having Ser. No. 60,075, filed July 24, 1979 by S. N. Chakravarti et al there is disclosed a merged charge memory wherein the storage capacitor or cell includes a first plate made of doped polysilicon and a second plate has a floating conductive N diffusion region in a P-type substrate acting as a reservoir of electrons to provide increased signal strength.

In commonly assigned U.S. Pat. No. 4,160,275, filed on Apr. 3, 1978, by H. S. Lee, W. D. Pricer and N. G. Vogl, Jr., there is disclosed an accessing arrangement which is particularly suitable for a merged charge memory produced in unipolar technology of the type described hereinabove wherein the minimum pitch of a sense amplifier may be several times the dimension of the desired or optimum bit line pitch of a merged charge memory array by selecting at one time only a small number of cells, such as a byte, associated with a word line for writing or reading purposes.

In commonly assigned U.S. patent application having Ser. No. 134,259, filed Mar. 26, 1980, by W. D. Pricer, there is disclosed a sense amplifying system having first and second bit lines and first and second differential amplifiers arranged in tandem with a first isolation device connecting one side of the first amplifier to the first bit line and a second isolation device connecting the other side of the first amplifier to the second bit line and with a third isolation device connecting one side of the second amplifier to the first bit line and a fourth isolation device connecting the other side of the second amplifier to the second bit line. A precharging circuit charges the first and second lines to the same potential. The first amplifier is used to sense signals on the first line while using a reference voltage derived from the second line and the second amplifier is used to sense signals on the second line while using a reference voltage derived from the first word line.

IBM Technical Disclosure Bulletin Vol. 22 No. 7 December 1979 "One Device Dynamic Bipolar Memory with Dummy Cells" by J. E. Selleck discloses a reference level generation technique for a bipolar memory wherein the dummy signal is produced in a dummy cell which is made similar to that of the storage cells.

U.S. Pat. No. 3,909,631, filed Aug. 2, 1973, teaches a sensing technique for a one device FET memory which includes dummy cells having capacitors similar to those of the storage cells with the reference signal applied to the dummy cell capacitors being derived from voltages similar to those used to write ones and zeros in the memory. The reference voltage is provided by a circuit wherein ground is produced at one terminal and a high voltage is produced at a second terminal with these voltages being equalized by a transistor prior to being applied to the dummy cell capacitors.

In U.S. Pat. No. 3,678,473, filed June 4, 1970, the dummy cell capacitor has half the capacity of the storage cell capacitor.

DISCLOSURE OF THE INVENTION

It is an object of this invention to provide a sensing technique having improved tracking between a sense signal and a reference signal.

It is another object of this invention to provide a sensing technique for a memory system having an improved voltage reference level generation circuit.

It is yet another object of this invention to provide an improved sensing technique for a merged charge memory having similar storage and dummy cells wherein the voltage reference level or dummy signal is accurately generated to a level mid-way between the zero and one levels.

It is still another object of this invention to provide an improved sensing system for a memory of the one-device cell or merged charge memory type having voltage and parameter tracking.

In accordance with the teachings of this invention, a sensing technique or system is provided for a merged charge memory having similar storage and dummy cells with the dummy cells being charged with a reference voltage equal to ½ of the sum of the voltages representing one and zero binary digits of information in the memory. More specifically, the sensing technique or system includes an insulating layer disposed on a semiconductor substrate, a memory array having a data word line coupled to a first plurality of spaced apart conductive films disposed on the insulating layer defining a plurality of data storage capacitors, sensing means having first and second terminals and a dummy word line coupled to a second plurality of spaced apart conductive films disposed on the insulating layer defining a plurality of reference voltage capacitors. Charge source means are coupled to the first plurality of conductive films by the word line and to the second plurality of conductive films by the dummy word line. The first terminal of the sensing means is coupled to a conductive film of the first plurality of films spaced a predetermined distance from the charge source means and the second terminal of the sensing means is coupled to a given conductive film of the second plurality of films spaced the predetermined distance from the charge source means. The reference voltage is derived from the first and second terminals of the sensing means and applied to the given conductive film.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
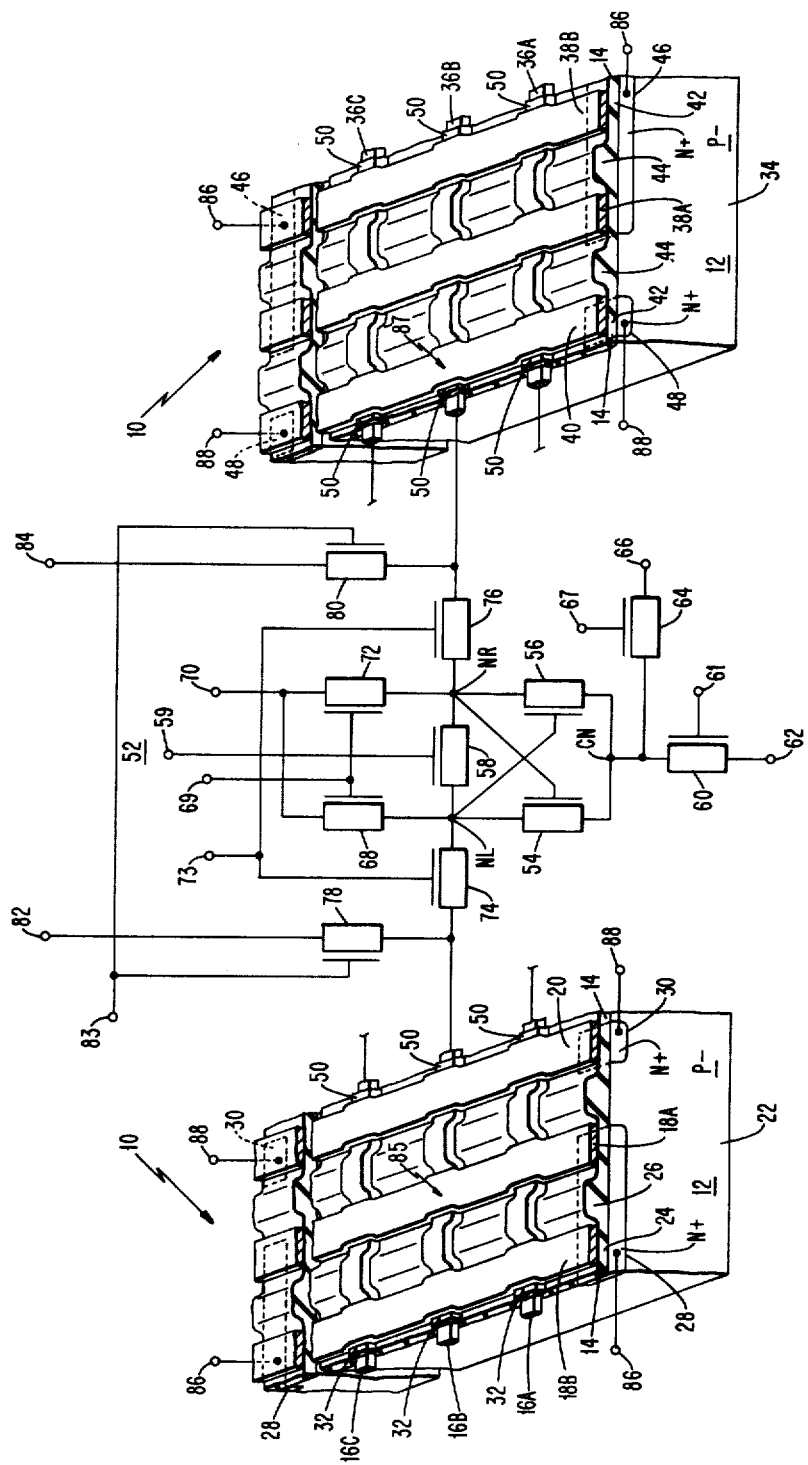
FIG. 1 is a circuit diagram, partly in isometric view, of an embodiment of a sensing system of the present invention.

Referring to FIG. 1 of the drawing in more detail, there is illustrated an embodiment of the sensing system of the present invention shown partly in isometric view. The system includes a memory array 10 having a semiconductor substrate 12, preferably P-type, with an insulating layer 14 disposed on the surface thereof. A first plurality of parallel bit/sense lines 16A, 16B and 16C, is formed on the insulating layer 14 and a first plurality of parallel word lines 18A and 18B and a first dummy line 20, arranged orthogonal to and over the bit/sense lines 16A, 16B and 16C and insulated therefrom, is also formed on the insulating layer 14 on a first portion 22 of substrate 12. The word lines 18A and 18B and dummy line 20 are disposed on thin portions 24 of the insulating layer 14 with thick portions 26, forming isolation regions, of the insulating layer 14 disposed between the parallel word and dummy lines 18A, 18B and 20. A first plurality of parallel N+ diffusion regions 28 are formed in the substrate 12 at the surface thereof under the word lines 18A and 18B and a first plurality of N+ diffusion regions 30 are formed in substrate 12 at the surface thereof under the dummy line 20 in the first portion 22 of the substrate 12. The bit/sense lines 16A, 16B and 16C are preferably made of doped polysilicon over which is formed a self-insulating layer 32 made of silicon dioxide. The word and dummy lines 18A, 18B and 20 may also be made of doped polysilicon but if preferred, may be made of metal, such as copper-doped aluminum.

On a second portion 34 of the semiconductor substrate 12, there is formed a second plurality of parallel bit/sense lines 36A, 36B and 36C on the insulating layer 14 and a second plurality of parallel word lines 38A and 38B and a second dummy line 40, arranged orthogonal to and over the bit/sense lines 36A, 36B and 36C and insulated therefrom, is also formed on the insulating layer 14. The word lines 38A and 38B and dummy line 40 are disposed on thin portions 42 of the insulating layer 14 with thick portions 44, forming isolation regions, of the insulating layer 14 disposed between the parallel word and dummy lines 38A, 38B and 40. A second plurality of parallel N+ diffusion regions 46 are formed in the substrate 12 at the surface thereof under the word lines 38A and 38B and a second plurality of N+ diffusion regions 48 are formed in substrate 12 at the surface thereof under the dummy line 40 in the second portion 34 of the substrate 12. The bit/sense lines 36A, 36B and 36C are also preferably made of doped polysilicon over which is formed a self-insulating layer 50 made of silicon dioxide. The word and dummy lines 38A, 38B and 40 may be made of doped polysilicon but, if preferred, may be made of metal. The entire upper surface of array 10 may be covered with standard passivating layers such a chemical vapor deposition oxide followed by a layer of phospho-silicate glass.

An amplifier and bit driver circuit 52 is illustrated interconnecting bit/sense line 16B disposed on the first portion 22 of the substrate 12 and bit/sense 36B disposed on the second portion 34 of the substrate 12. Other similar circuits, not shown in the interest of clarity, interconnect bit/sense lines 16A and 36A, and 16C and 36C.

The amplifier and bit driver circuit 52 includes first and second cross-coupled field effect transistors 54 and 56, respectively, forming a latch connected to a left node NL and a right node NR, with an equalizing transistor 58 interconnecting nodes NL and NR. A set transistor 60 is connected between the common node CN of latch 54, 56 and a low voltage VL terminal 62. A first restore transistor 64 is connected between a first high voltage VH supply terminal 66 and the common node CN, a second restore transistor 68 is connected between a second high voltage VH supply terminal 70 and the left node NL and a third restore transistor 72 is connected between the supply terminal 70 and the right node NR. A first isolating transistor 74 is connected between the bit/sense line 16B and the left node NL and a second isolating transistor 76 is connected between the bit/sense line 36B and right node NR. A first input-/output transistor 78 is connected between the bit/sense line 16B and a first input/output terminal 82 and a second input/output transistor 80 is connected between the bit/sense line 36B and a second input/output terminal 84. Terminals 86 are provided for the N+ diffusion regions 28 and 46 located under the word lines 18A and 18B, and 38A and 38B, respectively, and terminals 88 are provided for the N+ diffusion regions 30 and 48 located under the dummy lines 20 and 40, respectively.

It should be noted that, although not illustrated in the drawings, the amplifier and bit driver circuit 52 are formed in a known manner as integrated circuits on a third portion, not shown, of substrate 12 disposed between the first and second portions 22 and 34.

Figure 2:
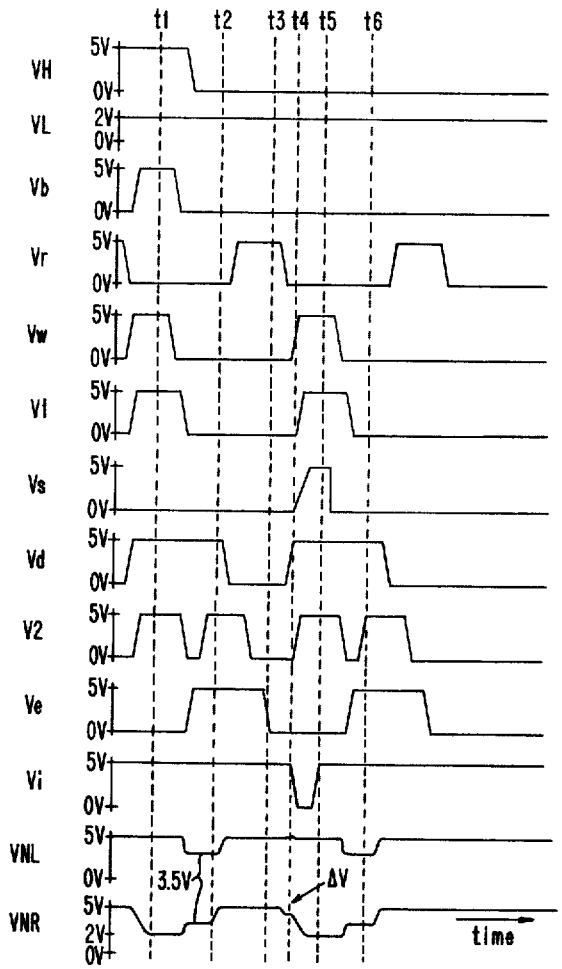
FIG. 2 is a pulse program which may be used to operate the sensing system of the invention illustrated in FIG. 1.
Figure 3:
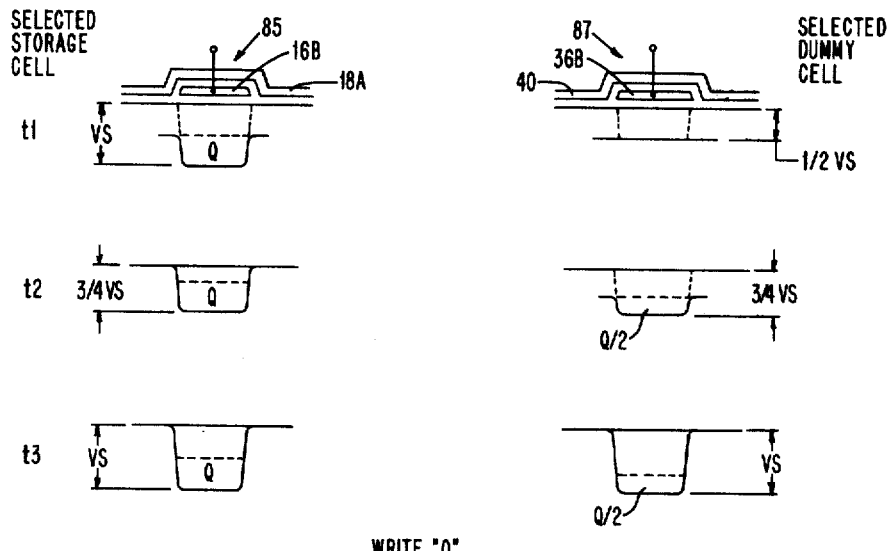
FIG. 3 illustrates potential wells formed in the embodiment of the invention illustrated in FIG. 1 at selected time periods during the operation of the circuit.

The operation of the embodiment of the system of the present invention illustrated in FIG. 1 of the drawings may best be understood by referring to the pulse program indicated in FIG. 2 and the potential wells illustrated in FIG. 3 of the drawings. It can be seen that a 0 binary digit of information is written into the bit/sense line 16B at time t1 in FIG. 2 by applying a high voltage VH to the input/output terminal 82 while applying a low voltage VL to input/output terminal 84 with a bit line drive gate voltage Vb applied to terminal 83 connected to the gate electrodes of transistors 78 and 80 while a word line select pulse Vw is applied to word line 18A, a dummy word line pulse Vd is applied to the dummy line 40 and a pulse Vi is applied to terminal 73. In order to apply charge to the storage cell 85 located at the intersection of the bit/sense line 16B and the word line 18A, the voltage V1 applied to terminal 86 was set at zero volts and then to remove all unnecessary charge, voltage V1 is raised to the magnitude VH or +5 volts in a known fill and spill operation. In order to apply charge to a reference cell 87 located at the intersection of the dummy line 40 and the bit/sense line 36B, the voltage V2 is similarly applied to terminals 88. With this arrangement, a quantity of charge Q is stored in selected storage cell 85 and no charge is stored in reference cell 87, as indicated in the potential wells at time t1 in FIG. 3 of the drawings where VS is the surface potential at storage cell 85 when both voltage Vw and voltage V2 are at +5 volts.

To apply a reference signal in reference cell 87 which is equal to one half of the sum of the charges in cells 85 and 87 at time t1, the word pulse Vw is turned off, as is the pulse V2 applied to N+ diffusion terminal 86, and then the equalizing transistor is turned on by applying pulse Ve to terminal 59 and with the dummy line pulse Vd still on, a charge Q/2 is stored in reference cell 87, as indicated in the potential well at time t2 of FIG. 3. Thus, parameter variations do not adversely affect the quality of the charge stored in the dummy cell. At time t3, a voltage restore bit line gate pulse Vr is applied to terminals 67 and 69 to store the charge Q in storage cell 85 with charge Q/2 being stored in reference cell 87, as indicated at time t3 in FIG. 3 of the drawing.

Information is read out of storage cell 85 at time t4 by applying the word pulse Vw to the word line 18A and the dummy pulse Vd to the dummy line 40 while voltages V1 and V2 are applied to the N+ diffusion regions 28 and 48, respectively. As is known, a voltage difference ΔV applied between nodes NL and NR causes the latch 54, 56 to flip in one direction or in the other direction depending on the polarity of the voltage ΔV. In this instance transistor 56 turns on and transistor 54 is off when the set latch gate pulse Vs is applied to terminal 61 turning on set transistor 60 to amplify the signal at the nodes NL and NR. By turning on input/output transistors 78 and 80 the information may be applied to terminals 82 and 84 for external use. Also the high voltage at NL may be applied to the bit/sense line 16B to restore the information in storage cell 85 at time t5. At time t6 the voltages in the system are applied to the system in the same manner as at time t2 to store the reference signal in reference cell 87 in preparation for another read operation.

It can be seen that if a 1 binary digit of information is to be stored in storage cell 85, the operation would be similar to that described hereinabove except that a low voltage VL is applied to the input/output terminal 82 and a high voltage VH is applied to the input/output terminal 84. It can also be seen that when a storage cell of a word line, such as 38A or 38B, on the second portion 34 of the substrate 12 is to be accessed or read out, the dummy word line 20 is used to provide the reference signal in the same manner as the dummy line 40 provides the reference signals for the storage cells of the word lines 18A or 18B on the first portion 22 of substrate 12.

It should be noted that the charge source, i.e., N+ diffusion region 28, for storage cell 85 is located from the storage cell 85 at a distance equal to the distance between reference cell 87 and its charge source, i.e., N+ diffusion region 48. It should also be noted that voltage N1 provides a single fill and spill operation for the word lines 18A, 18B, 38A and 38B with voltage V2 providing a double fill and spill operation for the dummy lines 20 and 40. However, if desired, N+ diffusion regions 28 and 30 and 86 and 88 may be merged into a single N+ diffusion region, in which case the voltage V1 would not be used.

Although the low voltage VL applied to the input/output terminals 82 and 84 and to terminal 62 is indicated as having a magnitude of +2 volts, this low voltage may be reduced to zero volts by providing an N diffusion region at the surface of the substrate 12 in each of the storage cells of the array 10, as taught in the above identified commonly assigned U.S. patent application by S. N. Chakravarti et al.

While the invention has been particularly shown and described with reference to the preferred embodiments thereof, it will be understood by those skilled in the art that various changes in form and details may be made therein without departing from the spirit and scope of the invention.

What is claimed is:
1. A system comprising;
a semiconductor substrate,
an insulating layer disposed on said substrate,
an array having a first line coupled to a first plurality of spaced apart conductive films disposed on said insulating layer defining a plurality of storage capacitors,
sensing means having first and second terminals,
a second line coupled to a second plurality of spaced apart conductive films disposed on said insulating layer defining a plurality of reference voltage capacitors,
a charge source means coupled to said first plurality of conductive films by said first line and to said second plurality of conductive films by said second line,
means for coupling said first terminal of said sensing means to a conductive film of said first plurality of films spaced a predetermined distance from said charge source means and for coupling said second input terminal to a given conductive film of said second plurality of films spaced said predetermined distance from said charge source means, and
means coupled to said sensing means for applying a reference voltage to said given conductive film.
2. A system comprising;
a semiconductor substrate,
an insulating layer disposed on said substrate,
a memory array having a data word line coupled to a first plurality of spaced apart conductive films disposed on said insulating layer defining a plurality of data storage capacitors,
sensing means having first and second terminals, a dummy word line coupled to a second plurality of spaced apart conductive films disposed on said insulating layer defining a plurality of reference voltage capacitors, charge source means coupled to said first plurality of conductive films by said data word line and to said second plurality of conductive films by said dummy word line, means for coupling said first terminal of said sensing means to a conductive film of said first plurality of films spaced a predetermined distance from said charge source means and for coupling said second terminal to a given conductive film of said second plurality of films spaced said predetermined distance from said charge source means, and means coupled to the first and second terminals of said sensing means for applying a reference voltage to said given conductive film.

3. A system as set forth in claim 2 wherein said charge source means includes first and second regions isolated from each other.

4. A system as set forth in claim 3 wherein said first region is coupled to said first plurality of conductive films and said second region is coupled to said second plurality of conductive films.

5. A system as set forth in claim 2 wherein said sensing means further includes means for selectively interconnecting said first and second terminals.

6. A system as set forth in claim 5 wherein said sensing means further includes first and second field effect transistors each having a gate electrode and at least one current carrying electrodes, said one current carry electrode of said first transistor and the gate electrode of said second transistor being connected to the first terminal of said sensing means and said one current carrying electrode of said second transistor and the gate electrode of said first transistor being connected to the second terminal of said sensing means.

7. A system as set forth in claim 2 wherein said array includes a first plurality of parallel data word lines coupled to the first terminal of said sensing means and a second plurality of parallel data word lines coupled to the second terminal of said sensing means, a plurality of dummy word lines, one of said dummy word lines being coupled to the first terminal of said sensing means and another of said dummy word lines being coupled to the second terminal of said sensing means, said predetermined distance being measured along one of said plurality of data word lines coupled to one of the first and second terminals of said sensing means and along one of said plurality of dummy word lines coupled to the other of the first and second terminals of said sensing means.

8. A system as set forth in claim 7 further including a first plurality of parallel bit/sense lines arranged orthogonal to said first plurality of parallel data word lines and a second plurality of parallel bit/sense lines arranged orthogonal to said second plurality of parallel data word lines, one of said bit/sense lines including the conductive film of said first plurality of films and another of said bit/sense lines including the given conductive film of said second plurality of films.

9. A system as set forth in claim 8 wherein said one bit/sense line and said another bit/sense line are each spaced said predetermined distance from said charge source means.

10. A system as set forth in claim 9 wherein said charge source means includes voltage means for operating said charge source means as a source of charges in a first instance and as a charge sink in a second instance.

11. A system as set forth in claim 10 wherein said charge source means includes an N+ diffusion region formed in said semiconductor substrate and said substrate is a P-type substrate.

* * * * *